(12) United States Patent
Tanaka

(10) Patent No.: US 10,777,499 B2
(45) Date of Patent: Sep. 15, 2020

(54) SEMICONDUCTOR MODULE, METHOD FOR MANUFACTURING THE SAME AND POWER CONVERSION APPARATUS

(71) Applicant: Mitsubishi Electric Corporation, Tokyo (JP)

(72) Inventor: Yasuo Tanaka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/969,809

(22) Filed: May 3, 2018

(65) Prior Publication Data
US 2019/0164880 A1    May 30, 2019

(30) Foreign Application Priority Data

Nov. 29, 2017 (JP) ................. 2017-229339

(51) Int. Cl.
| H01L 23/498 | (2006.01) |
| H01L 25/07 | (2006.01) |
| H01L 23/15 | (2006.01) |
| H01L 23/31 | (2006.01) |
| H02M 7/537 | (2006.01) |
| H01L 21/48 | (2006.01) |
(Continued)

(52) U.S. Cl.
CPC .... *H01L 23/49872* (2013.01); *H01L 21/4807* (2013.01); *H01L 21/4875* (2013.01); *H01L 23/15* (2013.01); *H01L 23/3121* (2013.01); *H01L 23/3735* (2013.01); *H01L 23/49866* (2013.01); *H01L 25/072* (2013.01); *H02M 7/003* (2013.01); *H02M 7/537* (2013.01); *H01L 23/49861* (2013.01); *H01L 2224/32225* (2013.01); *H01L 2224/48137* (2013.01); *H01L 2224/48227* (2013.01); *H01L 2224/73265* (2013.01)

(58) Field of Classification Search
CPC ........... H01L 23/3735; H01L 23/49872; H01L 25/072; H01L 23/15; H01L 23/3121; H01L 21/4807; H01L 21/4875; H01L 23/49861; H02M 7/537; H02M 7/003
See application file for complete search history.

(56) References Cited

U.S. PATENT DOCUMENTS 6,215,679 B1 *   4/2001   Yamane ................. H02M 7/003
                                                       257/E25.029
2004/0060968 A1 * 4/2004   Takahashi ............. C04B 37/021
                                                       228/122.1
(Continued)

FOREIGN PATENT DOCUMENTS

WO    2016-098431 A1    6/2016

*Primary Examiner* — Ermias T Woldegeorgis
(74) *Attorney, Agent, or Firm* — Studebaker & Brackett PC

(57) ABSTRACT

A conductive thin-film thinner than the undersurface electrode is provided outside the undersurface electrode on the undersurface of the ceramic substrate and connected to the undersurface electrode. A length from an outer circumferential part of the undersurface electrode to an outer circumferential pert of the ceramic substrate is equal to a length from an outer circumferential part of the top surface electrode to an outer circumferential part of the ceramic substrate. A thickness of the conductive thin-film is half or less than a thickness of the ceramic substrate.

18 Claims, 2 Drawing Sheets

(51) Int. Cl.
*H02M 7/00* (2006.01)
*H01L 23/373* (2006.01)

(56) References Cited

U.S. PATENT DOCUMENTS

2012/0293964 A1* 11/2012 Greuter ............... H01L 23/3735
 361/728
2017/0338189 A1* 11/2017 Soda ....................... H01L 25/18

* cited by examiner

SEMICONDUCTOR MODULE, METHOD FOR MANUFACTURING THE SAME AND POWER CONVERSION APPARATUS

BACKGROUND OF THE INVENTION

Field

The present invention relates to a semiconductor module, a method for manufacturing the same and a power conversion apparatus.

Background

Semiconductor modules are used to control motors for industrial equipment and electric railways or the like. Silicone gel is used as an insulation sealing material for semiconductor modules (e.g., see FIG. 20 in WO 2016/098431 A).

SUMMARY

When devices using a semiconductor module are operated at high altitudes, an atmospheric pressure is likely to drop. This causes bubbles in the silicone gel, producing partial discharge inside the module depending on the bubble generating area, which may shorten the service life of the module. Particularly when bubbles are generated in silicone gel at an eaves part below a ceramic substrate, partial discharge is more likely to occur even at a low voltage. Even when not used at high altitudes, bubbles are likely to accumulate in the eaves part due to degassing from a brazing material or solder of the ceramic substrate during assembly. The bubbles below the ceramic substrate may not be found by a visual inspection from above, causing insulating properties to deteriorate during use in the market.

In order to inhibit partial discharge, an undersurface electrode on a substrate undersurface may be extended outward compared to a top surface electrode. However, due to unbalance between the top surface electrode and the undersurface electrode, if a temperature cycle is added, stress is imposed on the ceramic board. When the stress exceeds bending strength of the ceramic substrate, the ceramic substrate may be cracked, causing insulating properties to deteriorate. As a result, reliability may degrade.

The present invention has been implemented to solve the above-described problem and it is an object of the present invention to provide a semiconductor module, a method for manufacturing the same and a power conversion apparatus capable of preventing degradation of reliability.

A semiconductor module according to the present invention includes: a base plate; a ceramic substrate provided on the base plate; an undersurface electrode provided on an undersurface of the ceramic substrate and bonded to the base plate; a top surface electrode provided on a top surface of the ceramic substrate; a semiconductor chip bonded to the top surface electrode; a conductive thin-film provided outside the undersurface electrode on the undersurface of the ceramic substrate, connected to the undersurface electrode and being thinner than the undersurface electrode; and an insulating resin sealing the ceramic substrate, the undersurface electrode, the top surface electrode, the semiconductor chip and the conductive thin-film, wherein a length from an outer circumferential part of the undersurface electrode to an outer circumferential part of the ceramic substrate is equal to a length from an outer circumferential part of the top surface electrode to an outer circumferential part of the ceramic substrate, and a thickness of the conductive thin-film is half or less than a thickness of the ceramic substrate.

In the present invention, the length from the outer circumferential part of the undersurface electrode to the outer circumferential part of the ceramic substrate is set to be equal to the length from the outer circumferential part of the top surface electrode to the outer circumferential part of the ceramic substrate. Stress to the ceramic substrate is thereby reduced. Furthermore, the conductive thin-film is provided outside the undersurface electrode on the undersurface of the ceramic substrate and connected to the undersurface electrode. Since the base plate and the conductive thin-film have an equal potential, the bubble generated in the insulating resin no longer share the potential, and thus, partial discharge is not generated in this region. Therefore, even when the bubble is generated, it is possible to keep high the voltage at which generation of partial discharge starts. The thickness of the conductive thin-film is reduced to half or less than the thickness of the ceramic substrate. Providing such a thin conductive thin-film has no effect on the ceramic substrate and it is thereby possible to prevent cracking of the ceramic substrate in a temperature cycle. As a result, it is possible to prevent degradation of reliability.

Other and further objects, features and advantages of the invention will appear more fully from the following description.

DESCRIPTION OF EMBODIMENTS

A semiconductor module, a method for manufacturing the same and a power conversion apparatus according to the embodiments of the present invention will be described with reference to the drawings. The same components will be denoted by the same symbols, and the repeated description thereof may be omitted.

First Embodiment

Figure 1:
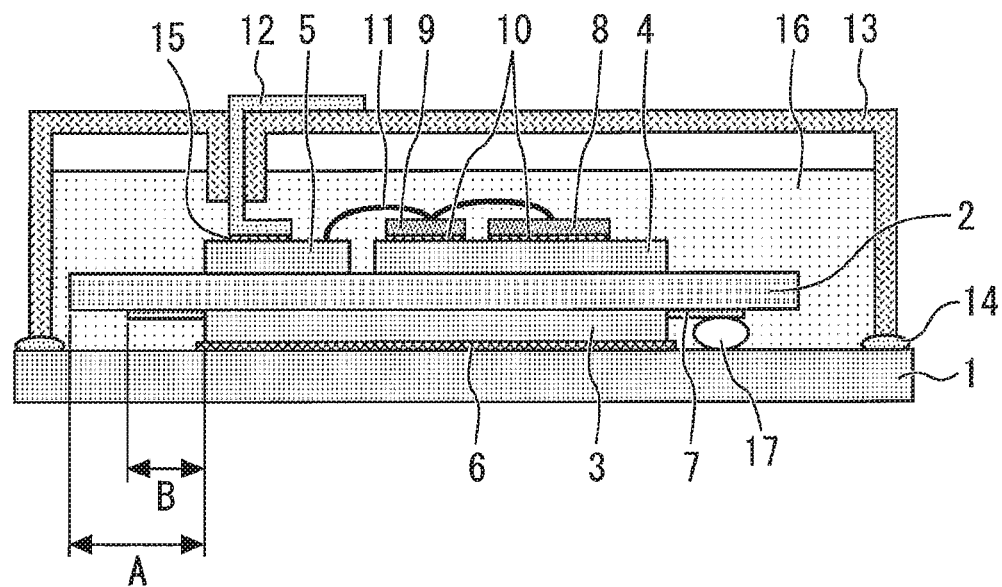
FIG. 1 is a cross-sectional view illustrating a semiconductor module according to a first embodiment.

FIG. 1 is a cross-sectional view illustrating a semiconductor module according to a first embodiment. A ceramic substrate 2 is provided on a cooling base plate 1. The ceramic substrate 2 is made of, for example, silicon nitride or aluminum nitride and has a thickness of 200 μm to 1.2 mm.

An undersurface electrode 3, and top surface electrodes 4 and 5 are bonded to an undersurface and a top surface of the ceramic substrate 2 respectively using a brazing material such as Ag. A desired pattern is formed through a photoengraving process and the top surface electrodes 4 and 5 are patterned through selective etching using an etchant such as an acid. The undersurface electrode 3 and the top surface electrodes 4 and 5 are made of metal such as copper. The undersurface electrode 3 is bonded to the base plate 1 via solder 6. The top surface electrodes 4 and 5 on the substrate top surface need to have a thickness on the order of 200 to 500 µm to allow a high current to flow. The undersurface electrode 3 on the substrate undersurface also needs an equivalent thickness to alleviate stress and reduce warpage of the ceramic substrate 2.

A conductive thin-film 7 which is thinner than the undersurface electrode 3 is provided outside the undersurface electrode 3 on the undersurface of the ceramic substrate 2 and is connected to the undersurface electrode 3. The conductive thin-film 7 has a small thickness of, for example, 4 to 6 µm so as to have a sufficiently low stress to the ceramic substrate 2 and is formed through electroless nickel plating or the like. Note that no other conductive films such as the conductive thin-film 7 are provided outside the top surface electrodes 4 and 5 on the top surface of the ceramic substrate 2.

A length from an outer circumferential part of the undersurface electrode 3 to an outer circumferential part of the ceramic substrate 2 is equal to a length from an outer circumferential part of the top surface electrode 4 or 5 to an outer circumferential part of the ceramic substrate 2. Therefore, a shape of a peripheral portion of the undersurface electrode 3 is substantially the same as a shape of a peripheral portion of the top surface electrode 4 or 5. A length B from the outer circumferential part of the undersurface electrode 3 to the outer circumferential part of the conductive thin-film 7 is equal to or greater than ⅓ of a length A from the outer circumferential part of the undersurface electrode 3 to the outer circumferential part of the ceramic substrate 2 (B≥⅓×A).

Semiconductor chips 8 and 9 are bonded to the top surface electrode 4 via solder 10. The semiconductor chip 8 is an IGBT and the semiconductor chip 9 is a free-wheel diode. Top surfaces of the semiconductor chips 8 and 9 are ultrasonic-bonded to the top surface electrode 5 via an aluminum wire 11.

A resin case 13 with which an electrode 12 is integrally molded is bonded to the base plate 1 via a silicone adhesive 14. The electrode 12 is bonded to the top surface electrode 5 via solder 15. Insulating resin 16 such as silicone gel is injected into the resin case 13 in a decompressed atmosphere and hardened through heat treatment. In this way, the insulating resin 16 seals the ceramic substrate 2, the undersurface electrode 3, the top surface electrodes 4 and 5, the semiconductor chips 8 and 9 and the conductive thin-film 7.

Figure 2:
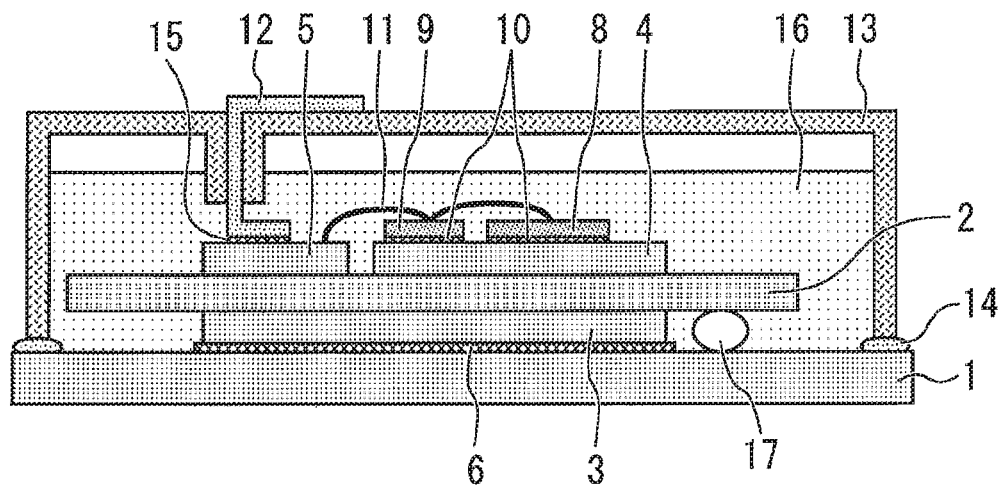
FIG. 2 is a cross-sectional view illustrating a semiconductor module according to a comparative example.

Next, effects of the present embodiment will be described in comparison with a comparative example. FIG. 2 is a cross-sectional view illustrating a semiconductor module according to a comparative example. There is no conductive thin-film 7 in the comparative example. If a bubble 17 is generated in the insulating resin 16 between the ceramic substrate 2 and the base plate 1 during assembly, partial discharge occurs even at a low applied voltage.

The undersurface electrode 3 on the substrate undersurface may be extended outward compared to the top surface electrodes 4 and 5 for inhibiting partial discharge. However, when a temperature cycle is added, stress applies to the ceramic substrate 2 due to unbalance between the top surface electrode and the undersurface electrode. When this stress exceeds the bending strength of the ceramic substrate 2, the ceramic substrate 2 is cracked and insulating properties are deteriorated. When, for example, the ceramic substrate 2 is an aluminum nitride substrate having a thickness of 600 µm, and the undersurface electrode 3 and the top surface electrodes 4 and 5 are copper plates having a thickness on the order of 500 µm, if the outer circumferential part of the undersurface electrode 3 is offset by 1 to 2 mm with respect to the outer circumferential part of the top surface electrodes 4 and 5, stress to the ceramic substrate 2 increases by 30 to 40% compared to a case without any offset.

Thus, in the present embodiment, the length from the outer circumferential part of the undersurface electrode 3 to the outer circumferential part of the ceramic substrate 2 is set to be equal to the length from the outer circumferential part of the top surface electrode 4 or 5 to the outer circumferential part of the ceramic substrate 2. Stress to the ceramic substrate 2 is thereby reduced.

Furthermore, the conductive thin-film 7 is provided outside the undersurface electrode 3 on the undersurface of the ceramic substrate 2 and connected to the undersurface electrode 3. Since the base plate 1 and the conductive thin-film 7 have an equal potential, the bubble 17 generated in the insulating resin 16 does not share the potential, and thus, partial discharge is not generated in this region. Therefore, even when the bubble 17 is generated, it is possible to keep high the voltage at which generation of partial discharge starts.

The smaller the thickness of the conductive thin-film 7, the smaller the stress to the ceramic substrate 2 becomes. Thus, in the present embodiment, the thickness of the conductive thin-film 7 is reduced to half or less than the thickness of the ceramic substrate 2. Providing such a thin conductive thin-film 7 has no effect on the ceramic substrate 2 and it is thereby possible to prevent cracking of the ceramic substrate 2 in a temperature cycle. As a result, it is possible to prevent degradation of reliability.

The bubble 17 below the ceramic substrate 2 is often generated from solder 6 bonding the undersurface electrode 3 to the base plate 1 and the brazing material bonding the undersurface electrode 3 to the ceramic substrate 2. This bubble 17 moves in the insulating resin 16 toward the outer circumferential part of the ceramic substrate 2. Therefore, the length B from the outer circumferential part of the undersurface electrode 3 to the outer circumferential part of the conductive thin-film 7 is set to be equal to or greater than ⅓ of the length A from the outer circumferential part of the undersurface electrode 3 to the outer circumferential part of the ceramic substrate 2. It is thereby possible for the conductive thin-film 7 to cover the region below the ceramic substrate 2 where the bubble 17 is likely to remain, and thus inhibit partial discharge.

Second Embodiment

Figure 3:
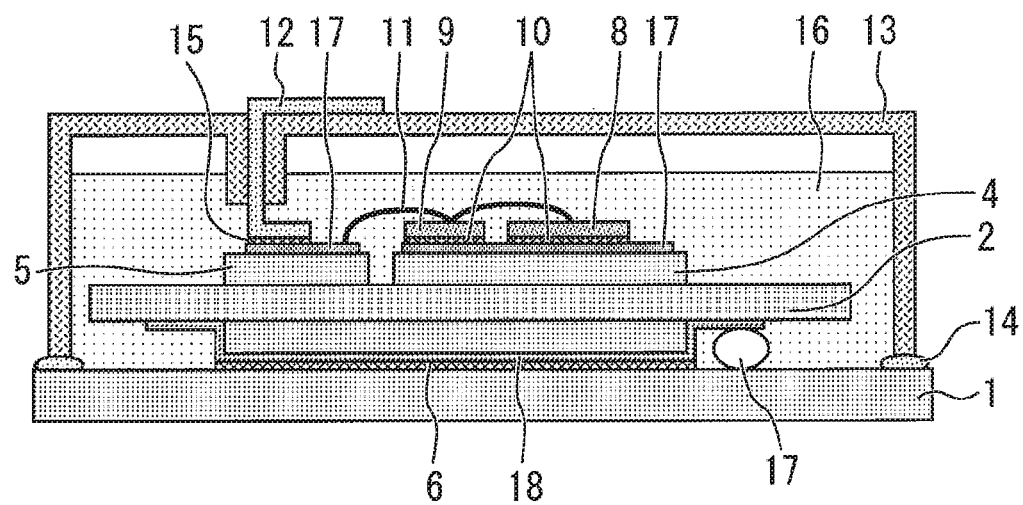
FIG. 3 is a cross-sectional view illustrating a semiconductor module according to a second embodiment.

FIG. 3 is a cross-sectional view illustrating a semiconductor module according to a second embodiment. In order to secure solderability necessary in posterior steps, an electroless nickel plating layer 18 is selectively formed on the surfaces of the undersurface electrode 3 and the top surface electrodes 4 and 5. In that case, the electroless nickel plating layer 18 is also formed on the undersurface of the ceramic substrate 2, and by patterning the electroless nickel plating layer 18, it is possible to form the conductive thin-film 7. In addition, it is possible to obtain effects similar to the effects of the first embodiment.

Note that the conductive thin-film 7 is not limited to electroless nickel plating, but may be formed using metal such as nickel, tin or solder through an electron beam vapor deposition or sputtering apparatus. In this case, when a work is set in an electron beam vapor deposition apparatus, the conductive thin-film 7 is selectively formed using a mask made of metal or the like patterned in advance. For this reason, the conductive thin-film 7 can be formed at low cost without using any step like a photoengraving process.

Moreover, the conductive thin-film 7 may be formed by extending a brazing material for bonding the undersurface electrode 3 to the undersurface of the ceramic substrate 2 and patterning the brazing material into a desired shape. It is thereby possible to selectively form the conductive thin-film 7 without adding any new step. Moreover, since a thin brazing material can inhibit excessive stress to the ceramic substrate 2, it is possible to use the manufacturing step of a normal metallized substrate as is, and manufacture a semiconductor module at low cost without using any additional step.

Moreover, the conductive thin-film 7 may also be formed by forming metal such as nickel, aluminum or copper into a desired shape using a cold spray technique. Using the cold spray technique, it is possible to process the conductive thin-film 7 in the atmosphere and selectively form the conductive thin-film 7 using a metallic or ceramic mask or the like prepared in advance, and thereby manufacture a semiconductor module at relatively low cost.

The conductive thin-film 7 may also be formed by forming a semi-conductive film such as a silicon nitride layer using a plasma CVD apparatus. By controlling a flow rate of ammonium of a silicon nitride film, it is possible to control conductivity of the conductive thin-film 7 when a high voltage is applied. Furthermore, the conductivity of the conductive thin-film 7 can even be controlled based on a thickness of a deposited film. Therefore, it is possible to control potential sharing from the undersurface electrode 3 to the base plate 1, thereby also control electric field strength between the top surface electrode 4 or 5 and the undersurface electrode 3 and adjust a partial discharge starting voltage. Furthermore, it is possible to selectively form the conductive thin-film 7 using a metallic or ceramic mask or the like prepared in advance, and thereby manufacture a semiconductor module at relatively low cost.

Moreover, the conductive thin-film 7 may also be formed by forming a polysilicon film or the like doped with an impurity using a CVD apparatus or the like. It is possible to control a resistance value of the conductive thin-film 7 based on an impurity concentration and thickness of a deposited film. Therefore, it is possible to control potential sharing from the undersurface electrode 3 to the base plate 1, thereby also control electric field strength between the top surface electrode 4 or 5 and the undersurface electrode 3 and adjust a partial discharge starting voltage. Furthermore, it is possible to selectively form the conductive thin-film 7 using a metallic or ceramic mask or the like prepared in advance, and thereby manufacture a semiconductor module at relatively low cost.

The semiconductor chips 8 and 9 are not limited to semiconductor chips formed of silicon, but instead may be formed of a wide-bandgap semiconductor having a bandgap wider than that of silicon. The wide-bandgap semiconductor is, for example, a silicon carbide, a gallium-nitride-based material, or diamond. A semiconductor chip formed of such a wide-bandgap semiconductor has a high voltage resistance and a high allowable current density, and thus can be miniaturized. The use of such a miniaturized semiconductor chip enables the miniaturization and high integration of the semiconductor module in which the semiconductor chip is incorporated. Further, since the semiconductor chip has a high heat resistance, a radiation fin of a heatsink can be miniaturized and a water-cooled part can be air-cooled, which leads to further miniaturization of the semiconductor module. Further, since the semiconductor chip has a low power loss and a high efficiency, a highly efficient semiconductor module can be achieved.

Both the semiconductor chips 8 and 9 are desirably formed of a wide-bandgap semiconductor. However, only one of the semiconductor chips 8 and 9 may be formed of a wide-bandgap semiconductor. Also in this case, the advantageous effects described in the first and second embodiments can be obtained.

Third Embodiment

In this embodiment, the semiconductor modules according to the first or second embodiment described above are applied to an electric power conversion device. The electric power conversion device is, for example, an inverter device, a converter device, a servo amplifier, or a power supply unit. Although the present invention is not limited to a specific electric power conversion device, a case where the present invention is applied to a three-phase inverter will be described below.

Figure 4:
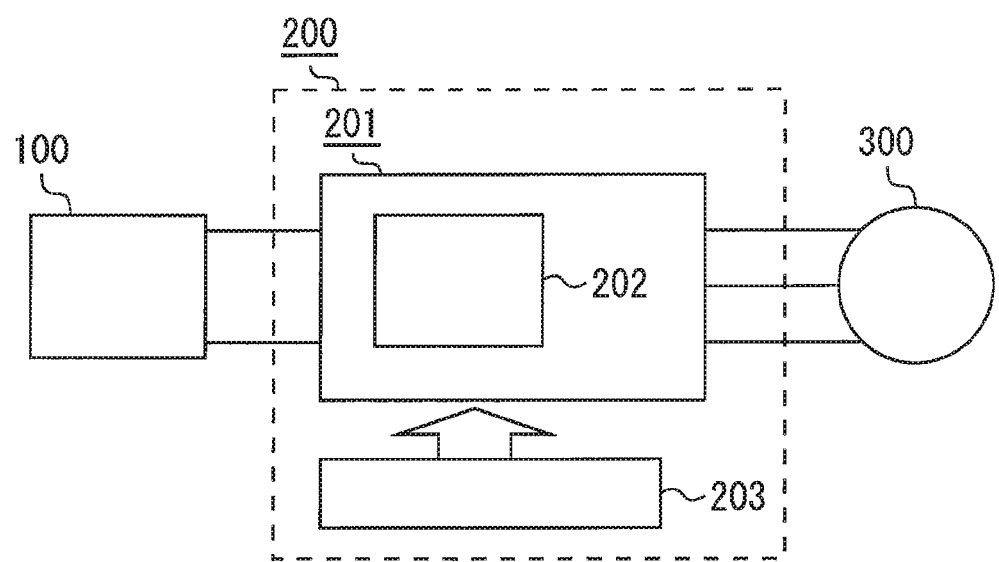
FIG. 4 is a block diagram illustrating a configuration of an electric power conversion system to which the electric power conversion device according to the third embodiment is applied.

FIG. 4 is a block diagram illustrating a configuration of an electric power conversion system to which the electric power conversion device according to the third embodiment is applied. This electric power conversion system includes a power supply 100, an electric power conversion device 200, and a load 300. The power supply 100 is a DC power supply and supplies DC power to the electric power conversion device 200. The power supply 100 can be composed of various components. For example, the power supply 100 can be composed of a DC system, a solar cell, or a storage battery, or may be composed of a rectifier or an AC/DC converter, which is connected to an AC system. Alternatively, the power supply 100 may be composed of a DC/DC converter that convers DC power output from a DC system to predetermined power.

The electric power conversion device 200 is a three-phase inverter connected to a node between the power supply 100 and the load 300, converts DC power supplied from the power supply 100 into AC power, and supplies the AC power to the load 300. The electric power conversion device 200 includes a main conversion circuit 201 that converts DC power into AC power and outputs the AC power, and a control circuit 203 that outputs a control signal for controlling the main conversion circuit 201 to the main conversion circuit 201.

The load 300 is a three-phase electric motor that is driven by AC power supplied from the electric power conversion device 200. The load 300 is not limited to a specific application. The load is used as an electric motor mounted on various electric devices, such as an electric motor for, for example, a hybrid vehicle, an electric vehicle, a railroad vehicle, an elevator, or an air-conditioner.

The electric power conversion device 200 will be described in detail below. The main conversion circuit 201 includes a switching device and a reflux diode (not illustrated). When the switching device is switched, the main conversion circuit 201 converts DC power supplied from the power supply 100 into AC power, and supplies the AC power to the load 300. The main conversion circuit 201 may have various types of specific circuit configurations. The main conversion circuit 201 according to this embodiment is a two-level three-phase full-bridge circuit, which can be composed of six switching devices and six reflux diodes connected in antiparallel with the respective switching devices. Each switching device and each reflux diode of the main conversion circuit 201 are composed of a semiconductor device 202 corresponding to the first or second embodiment described above. Every two switching devices of the six switching devices are connected in series and constitute a vertical arm. Each vertical arm constitutes each phase (U-phase, V-phase, W-phase) of the full-bridge circuit. Output terminals of each vertical arm, i.e., three output terminals of the main conversion circuit 201, are connected to the load 300.

Further, the main conversion circuit 201 includes a drive circuit (not illustrated) that drives each switching device. The drive circuit may be incorporated in the semiconductor device 202. Another drive circuit different from the semiconductor device 202 may be provided. The drive circuit generates a drive signal for driving each switching device of the main conversion circuit 201, and supplies the generated drive signal to a control electrode of each switching device of the main conversion circuit 201. Specifically, the drive circuit outputs, to the control electrode of each switching device, a drive signal for turning on each switching device and a drive signal for turning off each switching device, according to the control signal output from the control circuit 203, which is described later. When the ON-state of each switching device is maintained, the drive signal is a voltage signal (ON signal) having a voltage equal to or higher than a threshold voltage of the switching device. When the OFF-state of each switching device is maintained, the drive signal is a voltage signal (OFF signal) having a voltage equal to or lower than the threshold voltage of the switching device.

The control circuit 203 controls each switching device of the main conversion circuit 201 so as to supply a desired power to the load 300. Specifically, the control circuit 203 calculates a period (ON period), in which each switching device of the main conversion circuit 201 is in the ON state, based on the power to be supplied to the load 300. For example, the main conversion circuit 201 can be controlled by a PWM control for modulating the ON period of each switching device depending on the voltage to be output. Further, the control circuit 203 outputs a control command (control signal) to the drive circuit included in the main conversion circuit 201 so that the ON signal is output to each switching device to be turned on and an OFF signal is output to each switching device to be turned off at each point. The drive circuit outputs the ON signal or OFF signal, as the drive signal, to the control electrode of each switching device according to the control signal.

In the electric power conversion device according to this embodiment, the semiconductor devices according to the first or second embodiment are applied as the semiconductor device 202. Accordingly, degradation of reliability can be prevented.

While this embodiment illustrates an example in which the present invention is applied to a two-level threo-phase inverter, the present invention is not limited to this and can be applied to various electric power conversion devices. While this embodiment illustrates a two-level electric power conversion device, the present invention can also be applied to a three-level or multi-level electric power conversion device. When power is supplied to a single-phase load, the present invention may be applied to a single-phase inverter. The present invention can also be applied to a DC/DC converter or an AC/DC converter when power is supplied to a DC load or the like.

Further, in the electric power conversion device to which the present invention is applied, the above-mentioned load is not limited to an electric motor. For example, the load may also be used as a power supply device for an electric discharge machine, a laser beam machine, an induction heating cooker, or a non-contact device power feeding system. More alternatively, the load may be used as a power conditioner for a photovoltaic power generating system, an electricity storage system, or the like.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2017-229339, filed on Nov. 29, 2017 including specification, claims, drawings and summary, on which the Convention priority of the present application is based, is incorporated herein by reference in its entirety.

The invention claimed is:

1. A semiconductor module comprising:
   a base plate;
   a ceramic substrate provided on the base plate;
   an undersurface electrode provided on an undersurface of the ceramic substrate and bonded to the base plate;
   a top surface electrode provided on a top surface of the ceramic substrate;
   a semiconductor chip bonded to the top surface electrode;
   a conductive thin-film made of a material different from a material of the undersurface electrode, provided outside the undersurface electrode on the undersurface of the ceramic substrate, connected to the undersurface electrode and being thinner than the undersurface electrode; and
   an insulating resin sealing the ceramic substrate, the undersurface electrode, the top surface electrode, the semiconductor chip and the conductive thin-film,
   wherein a length from an outer circumferential part of the undersurface electrode to an outer circumferential part of the ceramic substrate is equal to a length from an outer circumferential part of the top surface electrode to the outer circumferential part of the ceramic substrate,
   a thickness of the conductive thin-film is half or less than a thickness of the ceramic substrate,
   the conductive thin-film is absent from the top surface of the ceramic substrate, and
   the material of which the conductive thin-film is made extends between the undersurface electrode and the base plate.

2. The semiconductor module according to claim 1, wherein a length from the outer circumferential part of the undersurface electrode to an outer circumferential part of the conductive thin-film is equal to or greater than ⅓ of a length from the outer circumferential part of the undersurface electrode to the outer circumferential part of the ceramic substrate.

3. The semiconductor module according to claim 2, wherein the semiconductor chip is made of a wide-band-gap semiconductor.

4. The semiconductor module according to claim 3, wherein the conductive thin-film is a semi-conductive film.

5. The semiconductor module according to claim 3 wherein the conductive thin-film is a polysilicon film doped with an impurity.

6. The semiconductor module according to claim 2, wherein the conductive thin-film is a semi-conductive film.

7. The semiconductor module according to claim 2, wherein the conductive thin-film is a polysilicon film doped with an impurity.

8. The semiconductor module according to claim 1, wherein the semiconductor chip is made of a wide-band-gap semiconductor.

9. The semiconductor module according to claim 8, wherein the conductive thin-film is a semi-conductive film.

10. The semiconductor module according to claim 8, wherein the conductive thin-film is a polysilicon film doped with an impurity.

11. The semiconductor module according to claim 1, wherein the conductive thin-film is a semi-conductive film.

12. The semiconductor module according to claim 1, wherein the conductive thin-film is a polysilicon film doped with an impurity.

13. A method for manufacturing the semiconductor module according to claim 1, comprising forming the conductive thin-film through an electron beam vapor deposition or sputtering apparatus.

14. A method for manufacturing the semiconductor module according to claim 1, comprising patterning a brazing material for bonding the undersurface electrode to the undersurface of the ceramic substrate to form the conductive thin-film.

15. A method for manufacturing the semiconductor module according to claim 1, comprising forming the conductive thin-film using a cold spray.

16. A power conversion apparatus comprising:
a main conversion circuit including the semiconductor module according to claim 1, converting input power and outputting converted power; and
a control circuit outputting a control signal for controlling the main conversion circuit to the main conversion circuit.

17. A method for manufacturing the semiconductor module, the semiconductor module comprising:
a base plate;
a ceramic substrate provided on the base plate;
an undersurface electrode provided on an undersurface of the ceramic substrate and bonded to the base plate;
a top surface electrode provided on a top surface of the ceramic substrate;
a semiconductor chip bonded to the top surface electrode;
a conductive thin-film made of a material different from a material of the undersurface electrode, provided outside the undersurface electrode on the undersurface of the ceramic substrate, connected to the undersurface electrode and being thinner than the undersurface electrode; and
an insulating resin sealing the ceramic substrate, the undersurface electrode, the top surface electrode, the semiconductor chip and the conductive thin-film,
wherein a length from an outer circumferential part of the undersurface electrode to an outer circumferential part of the ceramic substrate is equal to a length from an outer circumferential part of the top surface electrode to the outer circumferential part of the ceramic substrate, and
a thickness of the conductive thin-film is half or less than a thickness of the ceramic substrate,
the method comprising:
forming a plating layer on the undersurface of the ceramic substrate and the undersurface electrode; and
patterning the plating layer to form the conductive thin-film.

18. A method for manufacturing a semiconductor module, the semiconductor module comprising:
a base plate;
a ceramic substrate provided on the base plate;
an undersurface electrode provided on an undersurface of the ceramic substrate and bonded to the base plate;
a top surface electrode provided on a top surface of the ceramic substrate;
a semiconductor chip bonded to the top surface electrode;
a conductive thin-film provided outside the undersurface electrode on the undersurface of the ceramic substrate, connected to the undersurface electrode and being thinner than the undersurface electrode; and
an insulating resin sealing the ceramic substrate, the undersurface electrode, the top surface electrode, the semiconductor chip and the conductive thin-film,
wherein a length from an outer circumferential part of the undersurface electrode to an outer circumferential part of the ceramic substrate is equal to a length from an outer circumferential part of the top surface electrode to the outer circumferential part of the ceramic substrate, and
a thickness of the conductive thin-film is half or less than a thickness of the ceramic substrate,
the method comprising:
forming a plating layer on the undersurface of the ceramic substrate and the undersurface electrode; and
patterning the plating layer to form the conductive thin-film.

\* \* \* \* \*